(12) United States Patent
Lee

(10) Patent No.: US 6,229,703 B1
(45) Date of Patent: May 8, 2001

(54) COOLER DEVICE

(75) Inventor: Shun-Jung Lee, Pan-Chiao (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/348,405

(22) Filed: Jul. 7, 1999

(30) Foreign Application Priority Data

Sep. 4, 1998 (TW) ................................................. 87214666

(51) Int. Cl.[7] .................................................... H05K 7/20
(52) U.S. Cl. ........................... 361/704; 24/458; 257/719; 248/510; 361/710; 361/719
(58) Field of Search ..................... 24/657–458; 165/80.2, 165/80.3, 185; 174/16.3; 257/707, 713, 718–719, 726–727; 248/505, 510; 361/704, 707, 709–710, 715, 719–720, 697

(56) References Cited

U.S. PATENT DOCUMENTS

| | | | |
|---|---|---|---|
| 5,331,507 | * 7/1994 | Kyung et al. | 361/720 |
| 5,381,305 | * 1/1995 | Harmon et al. | 361/704 |
| 5,570,271 | * 10/1996 | Lavochkin | 361/704 |
| 5,818,695 | * 10/1998 | Olson | 361/719 |
| 5,828,553 | * 10/1998 | Chiou | 361/704 |
| 5,847,928 | * 12/1998 | Hinshaw et al. | 361/704 |
| 5,864,464 | * 1/1999 | Lin | 361/697 |
| 5,870,288 | * 2/1999 | Chen | 361/704 |
| 5,889,653 | * 3/1999 | Clemens et al. | 361/704 |
| 5,979,025 | * 11/1999 | Horng | 361/704 |
| 5,982,620 | * 11/1999 | Lin | 361/704 |
| 5,990,552 | * 11/1999 | Xie et al. | 257/718 |
| 6,075,699 | * 7/2000 | Rife | 361/704 |

* cited by examiner

Primary Examiner—Gregory Thompson
(74) Attorney, Agent, or Firm—Wei Te Chung

(57) ABSTRACT

A cooler device for fixing a CPU module on a printed circuit board comprises a heat sink having a base and a plurality of fins extending upward from the base and adjacent fins and a portion of the base therebetween defining a reception space. A clip is sized to be retained in one of the reception spaces between adjacent fins and includes a U-shaped portion having a first horizontal portion, two second horizontal portions extending from two ends of the U-shaped portion, and two vertical portions extending downward from the second horizontal portions and respectively forming a boardlock at the end thereof for engaging to the printed circuit board, thereby forcing the first horizontal portion of the U-shaped portion to abut against the base of the heat sink.

9 Claims, 3 Drawing Sheets

COOLER DEVICE

BACKGROUND OF THE INVENTION

1. Field of the Invention

The present invention relates to a cooler device, especially a cooler device adapted to be attached to a CPU module for effectively dissipating heat generated from the CPU module.

2. The Prior Art

A mother board of a personal computer has many components mounted thereon. Most of these components generate heat during operation, therefore, a fan is usually installed on the mother board for dissipating heat.

Since modulation has become a trend in the PC industry, a CPU is often configured with other components in a module box, therefore, a CPU module of this combination further requires a specific heat sink to dissipate heat in addition to the fan.

Considering the cost and efficiency heat dissipation, a simple and effective cooler device is earnestly required. In the conventional cooler device, such as U.S. Pat. No. 5,486,981 discloses a single-piece clip attaching to a heat sink for dissipating heat from the related CPU module. This clip requires complicated bending procedure to manufacture and it lacks of sufficient engagement with the heat sink therefore it can not meet the cost-down and simplicity trends. In Taiwan patent No. 313,278 another clip including four parts is disclosed, which is difficult to be assembled and does not meet the cost-down and simplicity requirement. It is requisite to provide a new cooler device which can solve the above problems.

SUMMARY OF THE INVENTION

The primary purpose of the present invention is to provide an improved cooler device having a one-piece clip attached to a heat sink for achieving cost-down and simplicity requirement.

In accordance with one aspect of the present invention, a cooler device for fixing a CPU module on a printed circuit board comprises a heat sink having a base and a plurality of fins extending upward from the base and adjacent fins and a portion of the base therebetween defining a reception space. A clip is sized to be retained in one of the reception spaces between adjacent fins and includes a U-shaped portion having a first horizontal portion, two second horizontal portions extending from two ends of the U-shaped portion, and two vertical portions extending downward from the second horizontal portions and respectively forming a boardlock at the end thereof for engaging to the printed circuit board, thereby forcing the first horizontal portion of the U-shaped portion to abut against the base of the heat sink.

DETAILED DESCRIPTION OF THE PREFERRED EMBODIMENT

Figure 1:
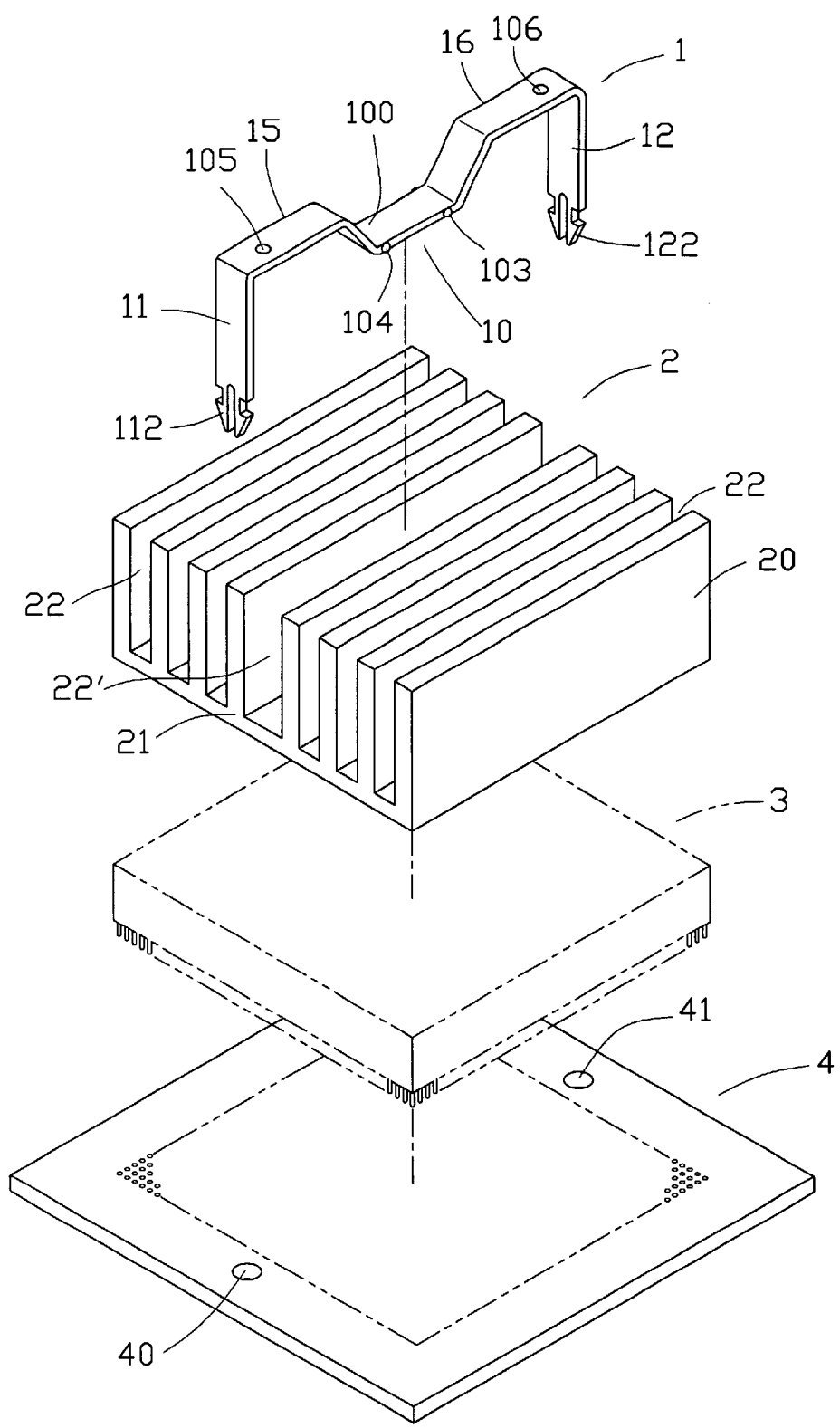
FIG. 1 is an exploded view of a cooler device in accordance with the present invention and related CPU module and printed circuit board.

Referring to FIG. 1, a cooler device in accordance with the present invention comprises a one-piece clip 1 and a heat sink 2 adapted to sandwich a CPU module 3 with a printed circuit board 4. The one-piece clip 1 is substantially a M-shaped plate made by stamping and bending. The clip 1 has a U-shaped pressing and engaging portion 10, two horizontal portions 15, 16 connected to two ends of the U-shaped pressing and engaging portion 10, and two vertical portion 11, 12 respectively extending downward from the horizontal portions 15, 16 and respectively forming board locks 112, 122 at the ends thereof. Two holes 105, 106 are respectively defined in the horizontal portions 15, 16. Also referring to FIG. 3, protrusions 101,. 102 and 103, 104 are respectively formed at opposite sides of a horizontal portion 100 of the U-shaped pressing and engaging portion 10.

The heat sink 2 has a base 21 and a plurality of parallel fins 20 extending upward from the base 21, thus defining reception spaces 22 between adjacent fins 20, wherein a central one 22' of the reception spaces 22 is particularly wider than other ones for receiving the clip 1. The heat sink 2 has a shape substantially identical to that of the CPU module 3. The printed circuit board 4 has two holes 40, 41 formed therein and distanced from each other with a distance substantially greater than the width of the CPU module 3.

Figure 2:
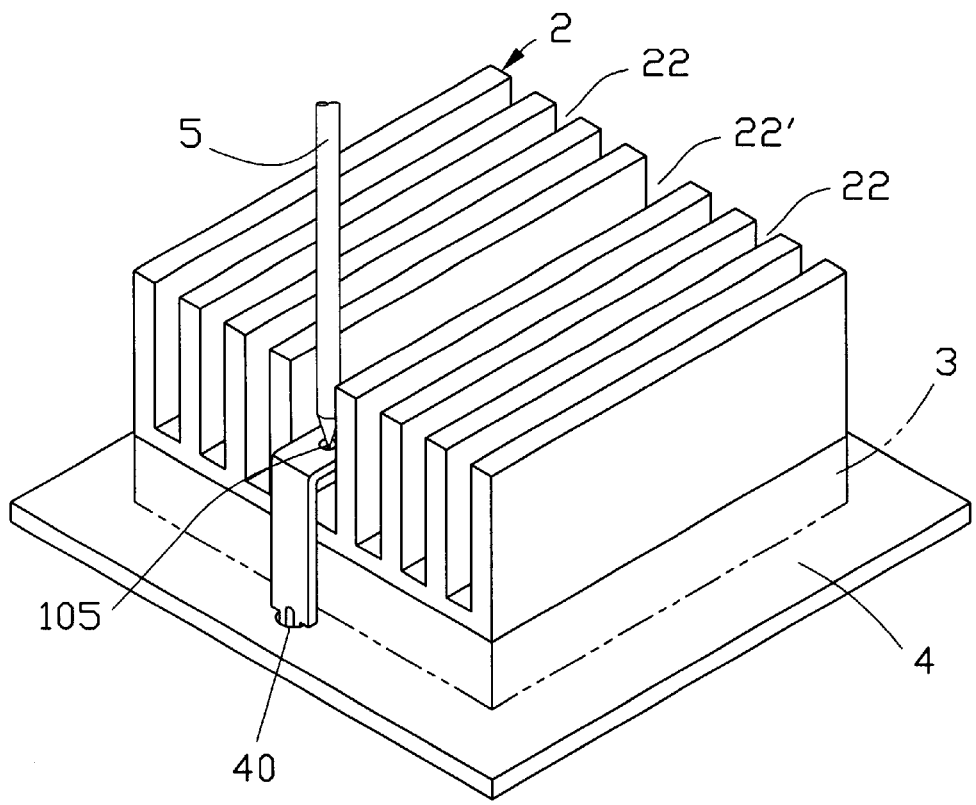
FIG. 2 is an assembled view of FIG. 1.
Figure 3:
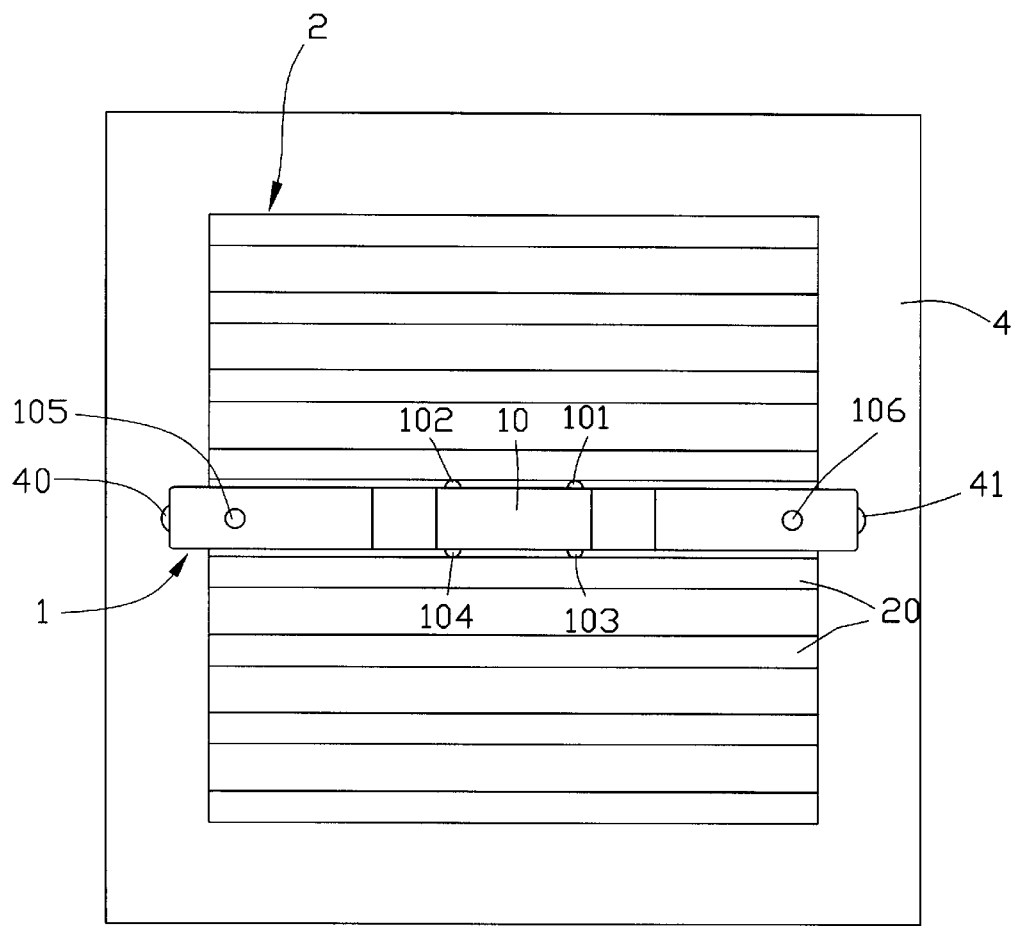
FIG. 3 is a top plan view of FIG. 2 for showing engagement relation between the clip and the heat sink thereof.

Referring to FIGS. 2 and 3, the cooler device is fixed to the printed circuit board 4 by forcing the board locks 112, 122 through the holes 40, 41 of the printed circuit board 4 via an external tool 5 such as a screw driver or the like, with the CPU module 3 sandwiched between the cooling device and the printed circuit board 4. The holes 105, 106 formed in the horizontal portions 15, 16 provide positioning space for the external tool 5. After the boardlocks 112, 122 are fixed to the printed circuit board 4, the horizontal portion 100 of the U-shaped pressing and engaging portion 10 of the clip 1 is maintained in close contact with the base 21 of the heat sink 2 and the protrusions 101, 102, 103, 104 thereof are firmly attached, with an interference fit, to opposite fins 20 besides the central reception space 22'. With the above structure, the heat sink 2 can be guaranteed to firmly attached to the CPU module 3 thereby providing effective heat dissipation for the CPU module 3.

While the present invention has been described with reference to a specific embodiment, the description is illustrative of the invention and is not to be construed as limiting the invention. Therefore, various modifications to the present invention can be made to the preferred embodiment by those skilled in the art without departing from the true spirit and scope of the invention as defined by the appended claims.

What is claimed is:

1. A cooler device for fixing a CPU module on a printed circuit board comprising:

a heat sink having a base and a plurality of fins extending upward from the base thereby defining a plurality of reception spaces between the fins; and a clip sized to be retained in one of the reception spaces and having a U-shaped portion including a first horizontal portion, two second horizontal portions extending from two ends of the U-shaped portion, and two vertical portions extending downward from the second horizontal portions and respectively forming a boardlock at the end thereof for engaging to the printed circuit board thereby forcing the first horizontal portion of the U-shaped portion to abut against the base of the heat sink;

wherein the first horizontal portion of the U-shaped portion has protrusions formed in opposite sides thereof for firmly fixing to the adjacent fins by interference.

2. The cooler device as claimed in claim 1, wherein the reception space, for retaining the U-shaped portion of the clip is substantially positioned in the center of the heat sink.

3. The cooler device as claimed in claim 1, wherein the reception space retaining the clip is wider than other reception spaces.

4. The cooler device as claimed in claim 3, wherein the wider reception space is located in the center of the heat sink.

5. The cooler device as claimed in claim 1, wherein at least one of the second horizontal portion has a hole therein for position of an external tool to press the clip in position in the reception space.

6. The cooler device as claimed in claim 1, wherein the clip is substantially a symmetric structure.

7. A cooler device for fixing a CPU module on a printed circuit board comprising:

a heat sink having a base and a plurality of fins extending upward from the base thereby defining a plurality of reception spaces between the fins; and a clip sized to be retained in one of the reception spaces and having a horizontal pressing and engaging plate positioned on the base of the heat sink, two multi-bent plates connected to the horizontal pressing and engaging plate for forcibly engaging to the printed circuit board thereby forcing the horizontal pressing and engaging plate to press the base of the heat sinks wherein the horizontal pressing and engaging plate has protrusions formed in opposite sides thereof for forcibly engaging with adjacent fins beside the reception space.

8. The cooler device as claimed in claim 7, wherein each of the multi-bent plates has a boardlock formed at one free end thereof.

9. A cooler device for fixing a CPU module on a printed circuit board comprising:

a heat sink having a base and a plurality of fins extending upward from the base thereby defining a plurality of reception spaces between the fins; and a clip sized to be retained in one of the reception spaces and having a horizontal pressing and engaging plate positioned on the base of the heat sink, two multi-bent plates connected to the horizontal pressing and engaging plate for forcibly engaging to the printed circuit board thereby forcing the horizontal pressing and engaging plate to press the base of the heat sink;

wherein each of the multi-bent plates has a hole formed therein for position of an external tool to forcibly move the horizontal pressing and engaging plate downward to the base of the heat sink.

* * * * *